(12) United States Patent
Wu et al.

(10) Patent No.: US 7,332,760 B2
(45) Date of Patent: Feb. 19, 2008

(54) FERROELECTRIC MATERIAL FOR FERROELECTRIC DEVICES

(75) Inventors: Tai-Bor Wu, Hsinchu (TW); Cheng-Lung Hung, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 186 days.

(21) Appl. No.: 11/165,938

(22) Filed: Jun. 24, 2005

(65) Prior Publication Data

US 2005/0286290 A1    Dec. 29, 2005

(30) Foreign Application Priority Data

Jun. 25, 2004    (TW)    .................................. 93118555

(51) Int. Cl.
*H01L 29/76*    (2006.01)

(52) U.S. Cl. ................ 257/295; 257/310; 257/E27.086
(58) Field of Classification Search .................. 257/295
See application file for complete search history.

(56) References Cited

U.S. PATENT DOCUMENTS 5,198,269 A * 3/1993 Swartz et al. ............... 427/226

FOREIGN PATENT DOCUMENTS

DE    2315008    * 10/1974

* cited by examiner

*Primary Examiner*—Long Pham
(74) *Attorney, Agent, or Firm*—Ladas & Parry, LLP

(57) ABSTRACT

A ferroelectric material includes a superlattice structure having lead zirconate layers and barium zirconate layers such that the superlattice structure has remanent polarization exhibiting a linearly positive dependency on a driving voltage.

28 Claims, 3 Drawing Sheets

FERROELECTRIC MATERIAL FOR FERROELECTRIC DEVICES

CROSS-REFERENCE TO RELATED APPLICATION

This application claims priority of Taiwanese application no. 093118555, filed on Jun. 25, 2004.

BACKGROUND OF THE INVENTION

1. Field of the Invention

This invention relates to a ferroelectric material, more particularly to a ferroelectric material including a superlattice structure with remanent polarization exhibiting a linearly positive dependency on a driving voltage.

2. Description of the Related Art

A ferroelectric material is characterized by its ferroelectric characteristic at a temperature lower than a critical temperature (Curie temperature). In the ferroelectric phase, each domain included in the ferroelectric material will exhibit electric-dipole alignment and produce self-spontaneous polarization.

The ferroelectric characteristic of the ferroelectric material can be described by polarization-electric field hysteresis loops. The hysteresis loops gradually saturate with an increase in the applied driving voltage (or electrical field). The remanent polarization of the ferroelectric material will exhibit a non-linear dependency on the applied driving voltage (or electric field). In addition, if the applied electric field is reversed, the remanent polarization will be offset and then be reversed. When the remanent polarization reaches zero during the reversing process, the applied reversed electric field is called a coercive field.

Conventional ferroelectric devices, such as ferroelectric random access memory (FeRAM) or optical devices, are made from the above-mentioned ferroelectric material, such as lead zirconate titanate. The remanent polarization of the ferroelectric material exhibits a non-linear dependency on the applied electric field. Therefore, control of the remanent polarization through adjustment of the applied electric field is difficult.

Therefore, there is still a need in the art to provide a ferroelectric device that has a controllable or predictable remanent polarization.

SUMMARY OF THE INVENTION

The object of the present invention is to provide a ferroelectric material that is clear of the abovementioned drawbacks of the prior art.

According to this invention, a ferroelectric material includes a superlattice structure having lead zirconate layers and barium zirconate layers such that the superlattice structure has remanent polarization exhibiting a linearly positive dependency on a driving voltage.

BRIEF DESCRIPTION OF THE DRAWINGS

Other features and advantages of the present invention will become apparent in the following detailed description of the preferred embodiment of the invention, with reference to the accompanying drawings. In the drawings.

DETAILED DESCRIPTION OF THE PREFERRED EMBODIMENT

Figure 1:
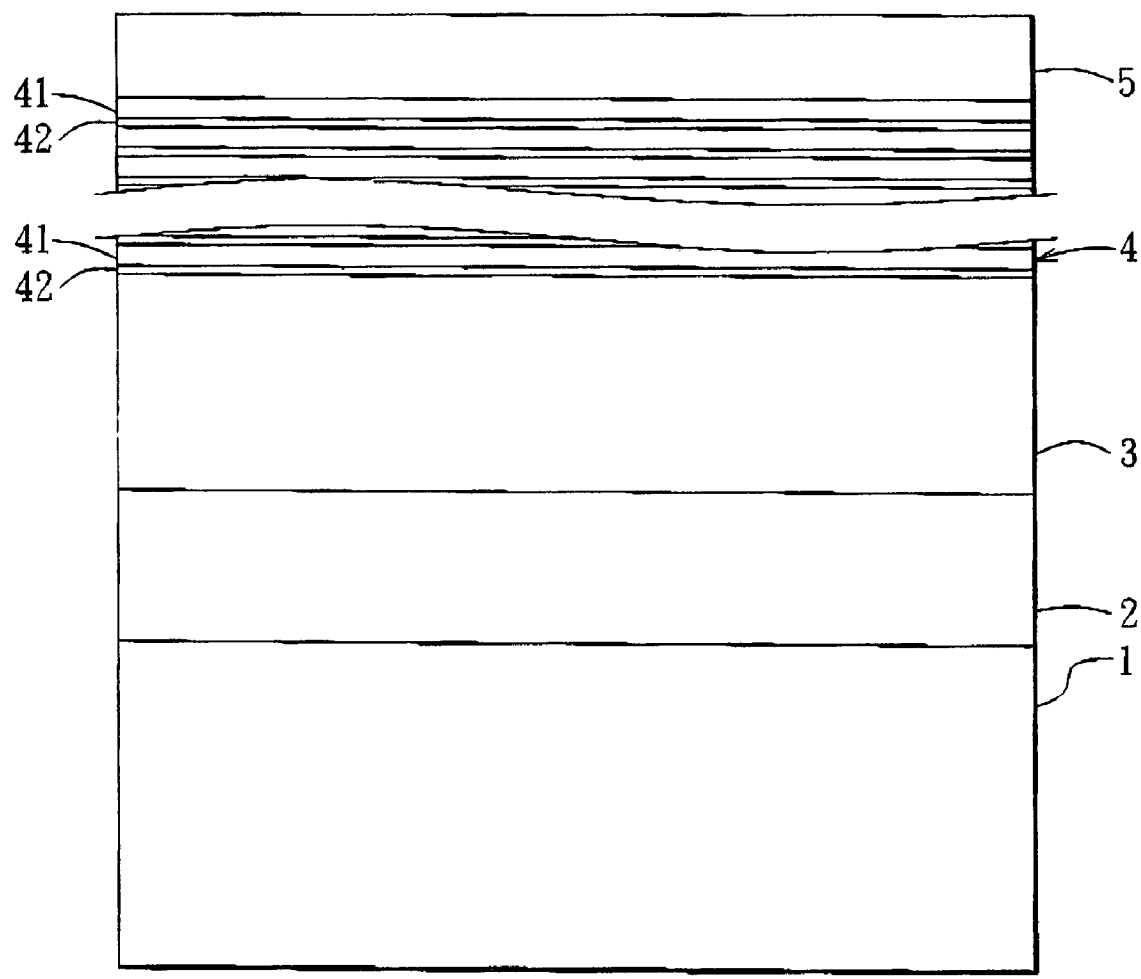
FIG. 1 is a fragmentary schematic view to illustrate the preferred embodiment of a ferroelectric device according to the present invention.

Before the present invention is described in greater detail, it should be noted that like elements are denoted by the same reference numerals throughout the disclosure.

Referring to FIG. 1, the preferred embodiment of the ferroelectric device according to the present invention includes a first electrode layer 2, a second electrode layer 5, and a superlattice structure 4 coupled to the first and second electrode layers 2, 4. Preferably, the superlattice structure 4 is sandwiched between the first and second electrode layers 2, 4, and the preferred embodiment further includes a buffer layer 3 interposed between the superlattice structure 4 and the first electrode layer 2, and a substrate 1 formed on the first electrode layer 2.

The first electrode layer 2 may be made from a conductive metal, such as Pt, Ti, Ta or others, or a conductive metal oxide, such as $LaNiO_3$ (LNO) and $Yba_2Cu_3O_{7-x}$ (YBCO). Preferably, the first electrode layer 2 is made from Pt. The second electrode layer 5 may be made from Pt, Au or other conductive metals. Preferably, the second electrode layer 5 is made from Pt.

The superlattice structure 4 includes lead zirconate ($PbZrO_3$, PZO) layers 41 and barium zirconate ($BaZrO_3$, BZO) layers 42. Preferably, the lead zirconate layers 41 are alternately disposed with the barium zirconate layers 42. The superlattice structure 4 has a thickness ranging from 100 nm to 300 nm. Preferably, the superlattice structure 4 has a thickness of 120 nm. Each lead zirconate has a thickness ranging from 2 to 6 nm, while each barium zirconate has a thickness ranging from 0.5 to 4 nm. The thickness ratio of each lead zirconate layer 41 to each barium zirconate layer 42 ranges from 4:1.5. Preferably, the thickness ratio of each lead zirconate layer 41 to each barium zirconate layer 42 is 3:1. Therefore, the superlattice structure 4 has a constrained ferroelectricity and an average composition formula of $(Pb_{1-x}Ba_x)ZrO_3$, where x is a number ranging from 0.2 to 0.4. Preferably, x=0.25.

The buffer layer 3 may be made from a conductive metal oxide selected from the group consisting of LNO, (La, Sr)$CoO_3$ (LSCO), $SrRuO_3$(SRO), and YBCO. Preferably, the buffer layer 3 is made from LNO. The buffer layer 3 has a thickness ranging from 200 nm to 300 nm. Preferably, the buffer layer 3 has a thickness of 270 nm. It is noted that the buffer layer 3 is not essential to the ferroelectric device according to the present invention, but is useful for assisting the superlattice structure 4 to grow in a preferred (001) direction so as to improve the ferroelectric characteristic of the superlattice structure 4.

In this preferred embodiment, the substrate 1 may be formed from a material selected from the group consisting of MgO, $SrTiO_3$ and Si. Preferably, the substrate 1 is a silicon substrate.

Figure 2:
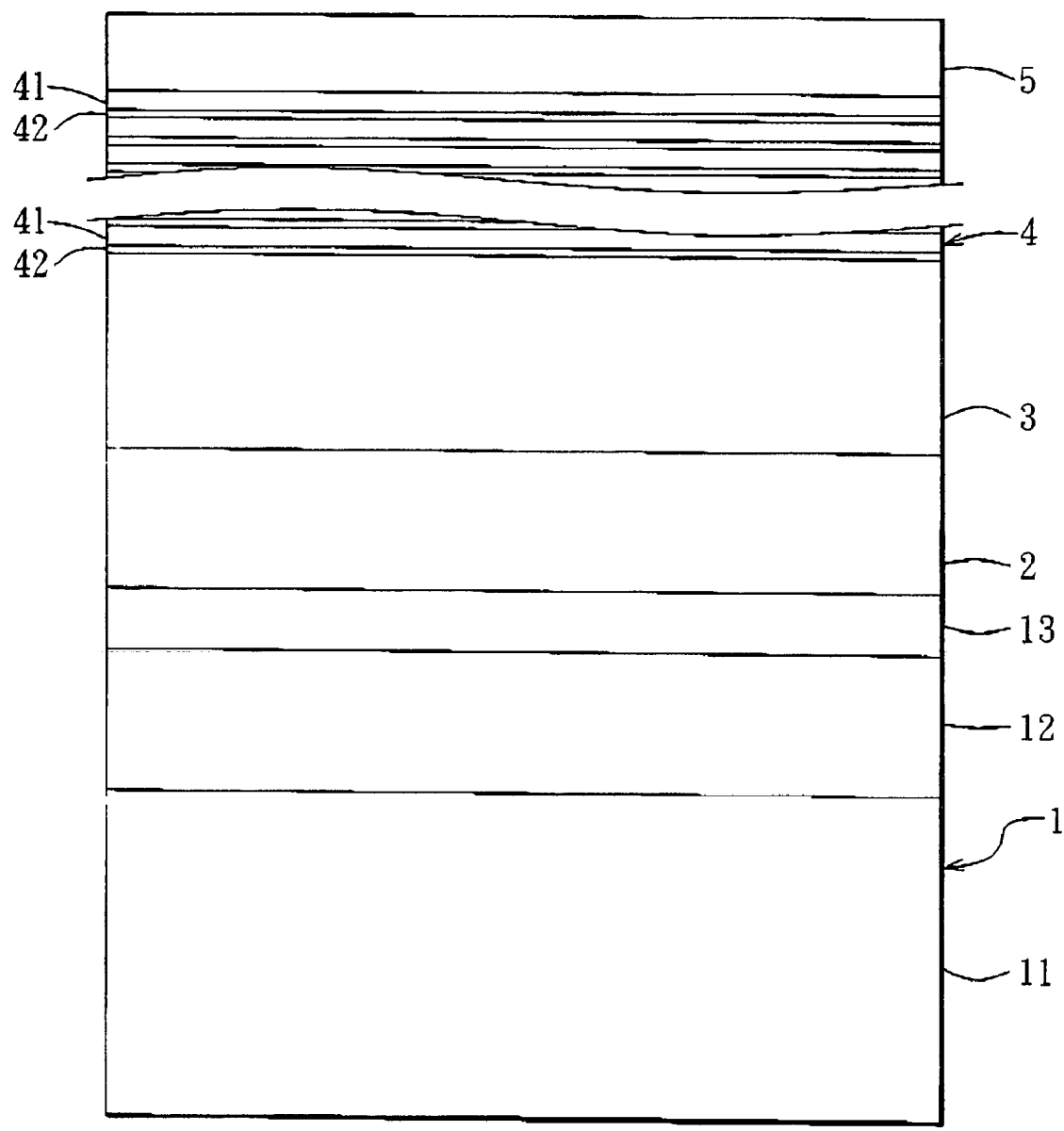
FIG. 2 is a fragmentary schematic view to illustrate a structural modification of the preferred embodiment of the ferroelectric device of FIG. 1.

FIG. 2 illustrates the structural modification of the preferred embodiment of the ferroelectric device of FIG. 1. The structural modification shown in FIG. 2 has a structure similar to the preferred embodiment of FIG. 1, except that a barrier layer 12 and an adhesive layer 13 are further included. The barrier layer 12 is sandwiched between the substrate 1 and the first electrode layer 2. The adhesive layer 13 is sandwiched between the barrier layer 12 and the first electrode layer 2 so as to enhance adhesion of the barrier layer 12 to the first electrode layer 2.

With respect to fabrication of the ferroelectric device according to this invention, for example, the barrier layer 12 of silicon oxide is formed on the substrate 1 of silicon by wet oxidation. The adhesive layer 13 of Ti is subsequently formed on the barrier layer 12 by double E-beam deposition so that adhesion of the barrier layer 12 to the first electrode layer 2 of Pt can be enhanced.

The buffer layer 3 of LNO is grown on the first electrode layer 2 in the (001) direction by radio frequency magnetron sputtering. The superlattice structure 4 is formed on the buffer layer 3 by radio frequency magnetron sputtering at a substrate temperature ranging from 450 to 650° C. Preferably, the substrate temperature is 475° C.

It is noted that since the operating temperature applied for fabricating the ferroelectric device according to the present invention is not higher than 500° C., fabrication of the ferroelectric device of this invention is compatible with silicon processing of integrated circuits, and will not result in damage or deterioration of integrated circuits.

Figure 3:
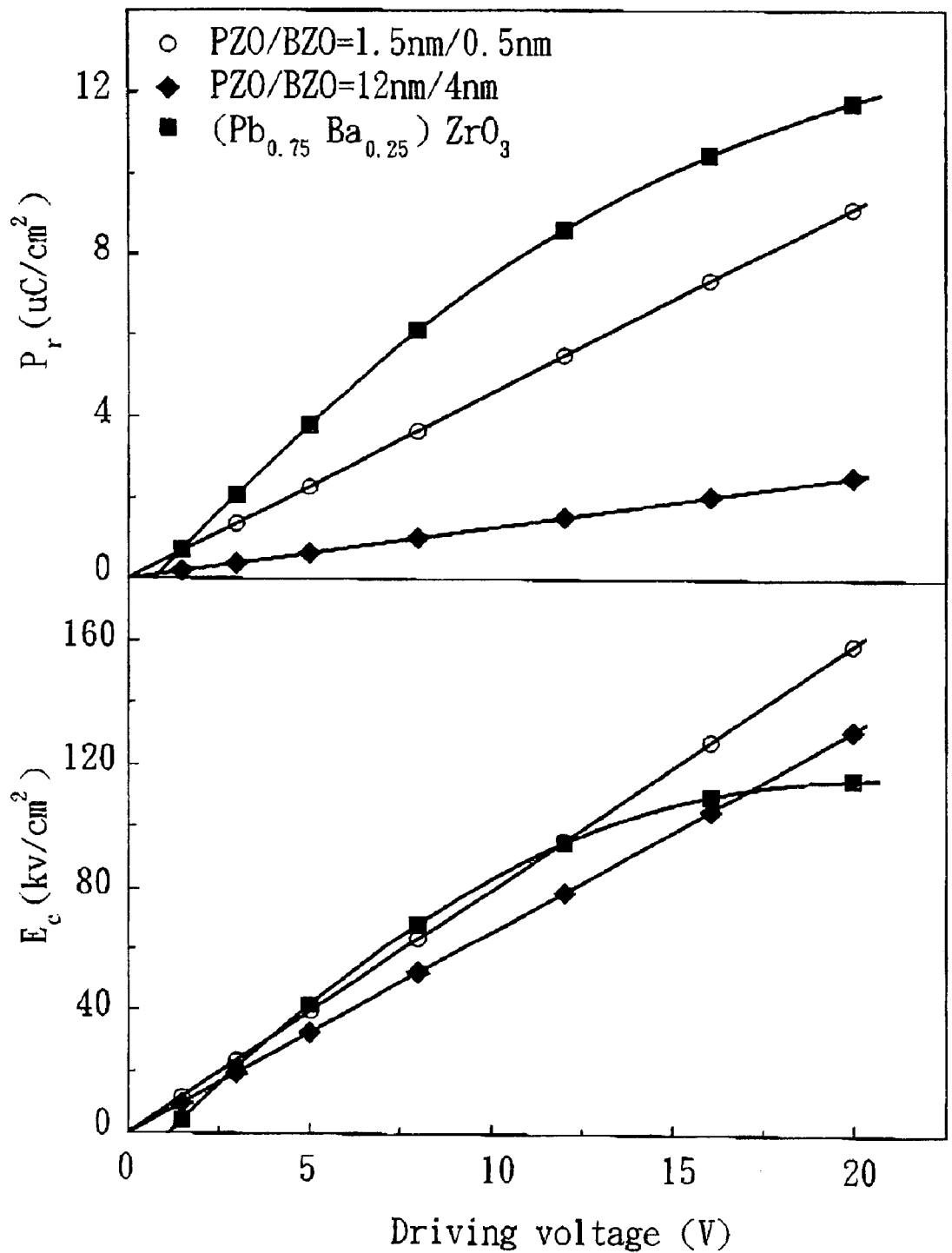
FIG. 3 is a plot to illustrate a comparison between the ferroelectric device with and without superlattice structure in dependency of remanent polarization and coercive field upon application of a driving voltage.

FIG. 3 shows dependency of the remanent polarization ($P_r$) and the coercive field ($E_c$) of the ferroelectric device of FIG. 2 upon application of a driving voltage thereto. The driving voltage (volt, V) was applied between the first electrode layer 2 and the second electrode layer 5, and ranged from 0 volt to 20 volts. Symbol "○" represents a first example of the ferroelectric device of FIG. 2, wherein each of the PZO layers 41 has a thickness of 1.5 nm, and each of the BZO layers 42 has a thickness of 0.5 nm. Symbol "◆" represents a second example of the ferroelectric device of FIG. 2, wherein each of the PZO layers 41 has a thickness of 12 nm, and each of the BZO layers 42 has a thickness of 4 nm. The thickness ratio of the PZO layers 41 to the BZO layers 42 in both the first and second examples of the ferroelectric device of FIG. 2 is 3:1. Symbol "■" represents a comparative ferroelectric device including a non-superlattice structure with an average composition formula of $(Pb_{1-x}Ba_x)ZrO_3$. The comparative ferroelectric device was manufactured by conventional sputtering techniques. From the results shown in FIG. 3, the remanent polarization and the coercive field of the first and second examples of the ferroelectric device of FIG. 2 exhibit a linearly positive dependency on the driving voltage, whereas the remanent polarization and the coercive field of the comparative ferroelectric device exhibits a non-linearly positive dependency on the driving voltage.

In view of the foregoing, by virtue of the linear dependency of remanent polarization and coercive field on the driving voltage, the remanent polarization of the ferroelectric device according to the present invention is controllable and predictable so that the ferroelectric device of the present invention is suitable for application to non-volatile ferroelectric memory, such as a multi-level memory, and optical communications devices, such as a wave guide.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A ferroelectric material comprising: a superlattice structure having lead zirconate layers and barium zirconate layers such that said superlattice structure has remanent polarization exhibiting a linearly positive dependency on a driving voltage, wherein said lead zirconate layers are alternately disposed with said barium zirconate layers.

2. The ferroelectric material as claimed in claim 1, wherein said superlattice structure has an average composition formula of $(Pb_{1-x}Ba_x)ZrO_3$, where x is a number ranging from 0.2 to 0.4.

3. The ferroelectric material as claimed in claim 2, wherein each of said lead zirconate layers has a thickness ranging from 2 to 6 nm, while each of said barium zirconate layers has a thickness ranging from 0.5 to 4 nm.

4. A ferroelectric device, comprising:
first and second electrode layers; and
a superlattice structure coupled to said first and second electrode layers and including lead zirconate layers and barium zirconate layers such that said superlattice structure has remanent polarization exhibiting a linearly positive dependency on a driving voltage, wherein said lead zirconate layers are alternately disposed with said barium zirconate layers.

5. The ferroelectric device as claimed in claim 4, wherein said superlattice structure has an average composition formula of $(Pb_{1-x}Ba_x)ZrO_3$, where x is a number ranging from 0.2 to 0.4.

6. The ferroelectric device as claimed in claim 5, wherein x=0.25.

7. The ferroelectric device as claimed in claim 5, wherein said superlattice structure is sandwiched between said first and second electrodes, said ferroelectric device further comprising a buffer layer interposed between said superlattice structure and said first electrode layer.

8. The ferroelectric device as claimed in claim 7, wherein said buffer layer is made from a conductive metal oxide selected from the group consisting of LNO, LSCO, SRO, and YBCO.

9. The ferroelectric device as claimed in claim 5, wherein said first electrode layer is made from a material selected from the group consisting of Pt, Ti, Ta, LNO and YBCO.

10. The ferroelectric device as claimed in claim 5, further comprising a substrate formed on said first electrode layer.

11. The ferroelectric device as claimed in claim 10, wherein said substrate is made from a material selected from the group consisting of MgO, $SrTiO_3$ and Si.

12. The ferroelectric device as claimed in claim 10, further comprising a barrier layer sandwiched between said substrate and said first electrode layer, and an adhesive layer sandwiched between said barrier layer and said first electrode layer.

13. The ferroelectric device as claimed in claim 12, further comprising a buffer layer interposed between said superlattice structure and said first electrode layer.

14. The ferroelectric device as claimed in claim 13, wherein said buffer layer is made from a conductive metal oxide selected from the group consisting of LNO, LSCO, SRO, and YBCO.

15. The ferroelectric device as claimed in claim 14, wherein said buffer layer is made from LNO, and said second electrode layer is made from Pt.

16. The ferroelectric device as claimed in claim 5, wherein each of said lead zirconate layers has a thickness ranging from 2 to 6 nm, while each of said barium zirconate layers has a thickness ranging from 0.5 to 4 nm.

17. A ferroelectric device, comprising:
first and second electrode layers; and
a superlattice structure coupled to said first and second electrode layers and including lead zirconate layers and barium zirconate layers such that said superlattice structure has remanent polarization exhibiting a linearly positive dependency on a driving voltage, wherein said superlattice structure has an average composition formula of $(Pb_{1-x}Ba_x)ZrO_3$, where x is a number ranging from 0.2 to 0.4.

18. The ferroelectric device as claimed in claim 17, wherein $x=0.25$.

19. The ferroelectric device as claimed in claim 17, wherein said superlattice structure is sandwiched between said first and second electrodes, said ferroelectric device further comprising a buffer layer interposed between said superlattice structure and said first electrode layer.

20. The ferroelectric device as claimed in claim 19, wherein said buffer layer is made from a conductive metal oxide selected from the group consisting of LNO, LSCO, SRO, and YBCO.

21. The ferroelectric device as claimed in claim 17, wherein said first electrode layer is made from a material selected from the group consisting of Pt, Ti, Ta, LNO and YBCO.

22. The ferroelectric device as claimed in claim 17, further comprising a substrate formed on said first electrode layer.

23. The ferroelectric device as claimed in claim 22, wherein said substrate is made from a material selected from the group consisting of MgO, $SrTiO_3$ and Si.

24. The ferroelectric device as claimed in claim 22, further comprising a barrier layer sandwiched between said substrate and said first electrode layer, and an adhesive layer sandwiched between said barrier layer and said first electrode layer.

25. The ferroelectric device as claimed in claim 24, further comprising a buffer layer interposed between said superlattice structure and said first electrode layer.

26. The ferroelectric device as claimed in claim 25, wherein said buffer layer is made from a conductive metal oxide selected from the group consisting of LNO, LSCO, SRO, and YBCO.

27. The ferroelectric device as claimed in claim 26, wherein said buffer layer is made from LNO, and said second electrode layer is made from Pt.

28. The ferroelectric device as claimed in claim 17, wherein each of said lead zirconate layers has a thickness ranging from 2 to 6 nm, while each of said barium zirconate layers has a thickness ranging from 0.5 to 4 nm.

* * * * *